United States Patent
Chu

(10) Patent No.: US 8,331,170 B2
(45) Date of Patent: Dec. 11, 2012

(54) DATA TRANSFER CIRCUIT, METHOD THEREOF, AND MEMORY DEVICE INCLUDING DATA TRANSFER CIRCUIT

(75) Inventor: Shin-Ho Chu, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 217 days.

(21) Appl. No.: 12/833,796

(22) Filed: Jul. 9, 2010

(65) Prior Publication Data

US 2011/0292746 A1 Dec. 1, 2011

(30) Foreign Application Priority Data

May 25, 2010 (KR) ........................ 10-2010-0048519

(51) Int. Cl.
*G11C 7/10* (2006.01)
(52) U.S. Cl. .......... 365/189.17; 365/189.02; 365/189.05
(58) Field of Classification Search .............. 365/189.17
See application file for complete search history.

(56) References Cited

U.S. PATENT DOCUMENTS

| | | | | |
|---|---|---|---|---|
| 6,304,933 | B1 * | 10/2001 | Craft | 710/114 |
| 6,335,898 | B2 * | 1/2002 | Watanabe et al. | 365/230.03 |
| 6,721,918 | B2 * | 4/2004 | Self et al. | 714/800 |
| 7,003,605 | B2 * | 2/2006 | Craft et al. | 710/106 |
| 7,161,992 | B2 * | 1/2007 | Anders et al. | 375/316 |
| 2003/0001184 | A1 | | 1/2003 | Anders et al. |
| 2005/0146357 | A1 * | | 7/2005 | Anders et al. ............. 326/86 |

FOREIGN PATENT DOCUMENTS

JP 2002-368087 12/2002
KR 1020090059838 6/2009

OTHER PUBLICATIONS

Notice of Preliminary Rejection issued from Korean Intellectual Property Office on Aug. 4, 2011.

\* cited by examiner

*Primary Examiner* — Son Mai
(74) *Attorney, Agent, or Firm* — IP & T Group LLP

(57) ABSTRACT

A data transfer circuit includes a first driver configured to drive a first line with data, a pattern alteration unit configured to change a pattern of the data transferred through the first line and produce a pattern-changed data, a second driver configured to drive a second line with the pattern-changed data; and a pattern restoration unit configured to receive the pattern-changed data transferred through the second line and restore the pattern of the data before the pattern change.

17 Claims, 10 Drawing Sheets

DATA TRANSFER CIRCUIT, METHOD THEREOF, AND MEMORY DEVICE INCLUDING DATA TRANSFER CIRCUIT

CROSS-REFERENCE TO RELATED APPLICATIONS

The present application claims priority of Korean Patent Application No. 10-2010-0048519, filed on May 25, 2010, which is incorporated herein by reference in its entirety.

BACKGROUND OF THE INVENTION

Exemplary embodiments of the present invention relate to a circuit for transferring data.

FIG. 1 illustrates a data transfer circuit for transferring a data from point A to point C through point B in an integrated circuit.

Referring to FIG. 1, a driver 110 positioned at point A transfers an input data DATA inputted thereto to point B through a line 120, and a driver 130 positioned at point B transfers the input data DATA to point C through a line 140. This is a typical structure of a data transfer circuit which transfers data from point A to point C through point B. As the distance from point A to point B and the distance from point B to point C become longer, each of the data transfer circuits for line 120 and line 140 is designed to have a greater load and have a stronger driving force in the driver 110 and the driver 130.

Hereafter, current consumption occurring in the data transfer circuit is divided into three cases and each case is described below.

Case 1

When an input data DATA input to the driver 110 is (H,L,H,L) in sequence, the data on each of lines 120 an 140 become (H,L,H,L) in sequence. Herein, to make data transitions on lines 120 and 130, significant current consumption occurs in both of the drivers 110 and 130. Thus, when a data pattern of (H,L,H,L) in sequence is used, significant current consumption occurs in data transfer circuits. Conditions deteriorate as the distances from point A to point B and the distance from point B to point C become longer.

Case 2

When the input data DATA input to the driver 110 are either (H,H,H,H) or (L,L,L,L) in sequence, the data on lines 120 and 140 do not transition. Since the data DATA do not transition, the current consumption in the driver 110 and the driver 130 is relatively small.

Case 3

When the input data DATA input to the driver 110 are (H,H,L,L) in sequence, the data on each of lines 120 and 140 become (H,H,L,L) in sequence. In this case, the number of data transitions is smaller than in Case 1 but larger than in Case 2. Therefore, the data transfer circuit in Case 3 consumes less current than that of Case 1 and more than that of Case 2.

As apparent from Cases 1, 2 and 3, the amount of current consumed in the conventional data transfer circuit may vary greatly according to a pattern of data transferred in the data transfer circuit. As such, the peak current of the data transfer circuit also greatly depends on the data pattern.

In many data transfer circuits, the total current consumption and the peak current of an integrated circuit is a significant performance criterion. When the peak current of the integrated circuit is relatively strong, a considerable amount of noise, power shortage, etc may occur.

An integrated circuit may include many data transfer circuits. However, the peak current consumed by the conventional data transfer circuit varies greatly depending on the data pattern. Therefore, a technology that can reduce the peak current of a data transfer circuit may be useful.

SUMMARY OF THE INVENTION

An embodiment of the present invention is directed to a technology that may reduce the intensity of a peak current consumed in a data transfer circuit.

In accordance with an embodiment of the present invention, a data transfer circuit includes: a first driver configured to drive a first line with data; a pattern alteration unit configured to change a pattern of the data transferred through the first line and produce a pattern-changed data; a second driver configured to drive a second line with the pattern-changed data; and a pattern restoration unit configured to receive the pattern-changed data transferred through the second line and restore the pattern of the data before the pattern-change.

The first line and the second line may have a relatively large load, whereas the load between the pattern alteration unit and the second driver may be relatively small. The pattern alteration unit may control the number of transitions of the pattern-changed data on the second line to be different from the number of transitions of the data on the first line for the same data.

The pattern alteration unit may invert a portion of consecutive data transferred through the first line. The pattern restoration unit may invert the inverted data received from the pattern alteration unit.

In accordance with another embodiment of the present invention, a data transfer circuit includes: a pattern alteration unit configured to change a pattern of an input data and produce a pattern-changed data; a first driver configured to drive a first line with the pattern-changed received from the pattern alteration unit; a pattern restoration unit configured to receive the pattern-changed data transferred through the first line and restore the pattern of the data before the pattern-change; and a second driver configured to receive the data with the restored pattern from the pattern restoration unit and drive a second line with the data having the restored pattern.

In accordance with yet another embodiment of the present invention, a memory device includes: a plurality of even pipe latches configured to sequentially receive data of an even first line; a plurality of odd pipe latches configured to sequentially receive data of an odd first line; a rising line driver configured to sequentially transfer the data stored in the plurality of the even pipe latches through a rising second line; and a falling line driver configured to sequentially transfer the data stored in the plurality of the odd pipe latches through a falling second line, wherein a group of even pipe latches among the plurality of the even pipe are configured to latch invert data inputted thereto, and a group of odd pipe latches among the plurality of the odd pipe latches are configured to invert data inputted thereto.

In accordance with yet another embodiment of the present invention, a method for transferring a data from a first point to a third point through a second point includes: driving data from the first point to the second point; changing a pattern of the data transferred to the second point and produce a pattern-changed data; and driving the pattern-changed data from the second point to the third point.

In a memory device according to an exemplary embodiment, the even first line may be referred to as an even global line; the odd first line, an odd global line; the rising second line, the rising line; and the falling second line, a falling line.

DESCRIPTION OF SPECIFIC EMBODIMENTS

Figure 1:
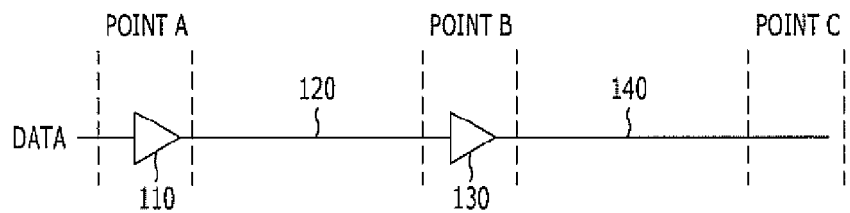
FIG. 1 illustrates a data transfer circuit for transferring data from point A to point C through point B in an integrated circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
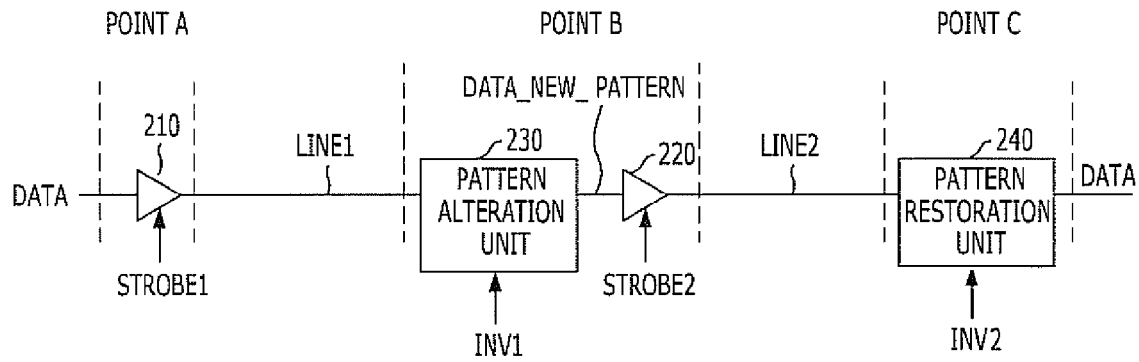
FIG. 2 illustrates a data transfer circuit in accordance with an embodiment of the present invention.

FIG. 2 illustrates a data transfer circuit in accordance with an embodiment of the present invention.

Referring to FIG. 2, the data transfer circuit includes a first driver 210 for driving data DATA through a first line LINE1, a pattern alteration unit 230 for changing a pattern of data DATA transferred through the first line LINE1, a second driver 220 for driving a pattern-changed data DATA_NEW_PATTERN produced in the pattern alteration unit 230, and a pattern restoration unit 240 for restoring the pattern of the pattern-changed data DATA_NEW_PATTERN transferred through a second line LINE2 back to its original data pattern.

The first driver 210 positioned at point A drives the data DATA to point B. As the distance from point A to point B is longer, the data transfer circuit is designed to have a stronger driving force in the first driver 210 and a greater load on the first line LINE1. A strobe signal STROBE1 input to the first driver 210 is a signal for strobing the first driver 210. Whenever the strobe signal STROBE1 is enabled, the first driver 210 drives data DATA through the first line LINE1.

The pattern alteration unit 230 positioned at point B changes the pattern of data DATA transferred through the first line LINE1. Changing a pattern of data means changing the pattern of data in such a manner that the number of data transition in data DATA on the first line LINE1 is different from the number of data transitions in data DATA on the second line LINE2. More specifically, the pattern alteration unit 230 may invert some of among consecutive data DATA transferred through the first line LINE1. For example, when four consecutive data are transferred through the first line LINE1, the pattern alteration unit 230 may invert the second data and the fourth data by enabling the pattern alteration unit 230 selectively for the selected data. When an inversion signal INV1 input to the pattern alteration unit 230 is enabled, the pattern alteration unit 230 inverts and outputs data of the first line LINE1. When the inversion signal INV1 is disabled, the pattern alteration unit 230 outputs the data of the first line LINE1 as received without inverting.

The second driver 220 positioned at point B drives the pattern-changed data DATA_NEW_PATTERN acquired from the pattern alteration unit 230 to point C. As the distance from point B to point C becomes longer, the second driver 220 is designed to have a stronger driving force and the load on the second line LINE2 becomes greater. A strobe signal STROBE2 input to the second driver 220 is a signal for strobing the second driver 220, and whenever the strobe signal STROBE2 is enabled, the second driver 220 drives output data of the pattern alteration unit 230 output to the second line LINE2.

The pattern restoration unit 240 positioned at point C restores the pattern of the pattern-changed data DATA_NEW_PATTERN transferred through the second line LINE2 back to the original form. The operation of the pattern restoration unit 240 is the same as the operation of the pattern alteration unit 230. For example, the pattern restoration unit 240 re-inverts the data inverted by the pattern alteration unit 230. In other words, if the pattern alteration unit 230 has inverted the second and fourth data among four consecutive data DATA, the pattern restoration unit 240 also inverts the second and fourth data among four consecutive data DATA so that the pattern-changed data DATA_NEW_PATTERN is changed back into its original pattern, which is the pattern of the data DATA. More specifically, when an inversion signal INV2 input to the pattern restoration unit 240 is enabled, the pattern restoration unit 240 inverts the input data from the second line LINE2 and outputs inverted data. When an inversion signal INV2 is disabled, the data of the second line LINE2 is outputted as is.

The following Table 1 shows the pattern of the data DATA on the first line LINE1, the pattern of the pattern-changed data DATA_NEW_PATTERN on the second line LINE2, and current consumption on the first line LINE1 and the second line LINE2, when the pattern alteration unit 230 and the pattern restoration unit 240 invert the second and fourth data among the four consecutive data. Meanwhile, the following Table 2 shows the pattern of the data DATA on the first line LINE1, the pattern of the pattern-changed data DATA_NEW_PATTERN on the second line LINE2, and current consumption on the first line LINE1 and the second line LINE2, when the pattern alteration unit 230 and the pattern restoration unit 240 are omitted.

TABLE 1

| Original Data | Data on Line 1, Level of Current Consumption | Data on Line 2, Level of Current Consumption |
| --- | --- | --- |
| H, H, L, L | (H, H, L, L), medium level | (H, L, L, H), medium level |
| H, H, H, H | (H, H, H, H), low level | (H, L, H, L), high level |
| L, L, L, L | (L, L, L, L), low level | (L, H, L, H), high level |
| H, L, H, L | (H, L, H, L), high level | (H, H, H, H), low level |
| L, H, L, H | (L, H, L, H), high level | (L, L, L, L), low level |

(The pattern alteration unit 230 and the pattern restoration unit 240 are present)

TABLE 2

| Original Data | Data on Line 1, Level of Current Consumption | Data on Line 2, Level of Current Consumption |
| --- | --- | --- |
| H, H, L, L | (H, H, L, L), medium level | (H, H, L, L), medium level |
| H, H, H, H | (H, H, H, H), low level | (H, H, H, H), low level |
| L, L, L, L | (L, L, L, L), low level | (L, L, L, L), low level |
| H, L, H, L | (H, L, H, L), high level | (H, L, H, L), high level |
| L, H, L, H | (L, H, L, H), high level | (L, H, L, H), high level |

(The pattern alteration unit 230 and the pattern restoration unit 240 are omitted)

Referring to Table 1, when the pattern alteration unit 230 and the pattern restoration unit 240 are present, if current consumption is high on one of the first line LINE1 and the second line LINE2, current consumption is not high on the other line regardless of the data pattern. Current consumption is not high at both first line LINE1 and second line LINE2. However, referring to Table 2, when the pattern alteration unit 230 and the pattern restoration unit 240 are omitted, current consumption may be high on both first line LINE1 and second line LINE2 for some data patterns.

When both of the pattern alteration unit 230 and the pattern restoration unit 240 (see Table 1) are present, a peak current is reduced regardless of data patterns. However, when the pattern alteration unit 230 and the pattern restoration unit 240 are absent (see Table 2), a peak current may increase for some data patterns.

Although the overall current consumption of the data transfer circuit may not be reduced, a peak current is reduced in the data transfer circuit. In other words, with reduced peak current in the data transfer circuit, a system to which the data transfer circuit is applied may stably operate.

The above-described peak current reduction is enhanced, as the distance between point A and point B and the distance between point B and point C become relatively longer and the distance between the pattern alteration unit 230 and the second driver 220 and the distance between the pattern restoration unit 240 and a subsequent driver (not shown) of the pattern restoration unit 240 become shorter.

Figure 3:
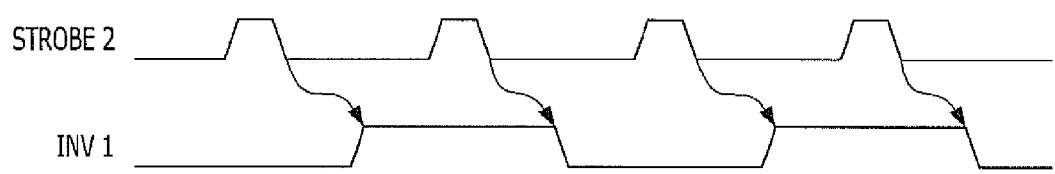
FIG. 3 illustrates a relationship between a strobe signal STROBE2 and an inversion signal INV1 shown in FIG. 2.

FIG. 3 illustrates an exemplary timing relationship between the strobe signal STROBE2 and the inversion signal INV1 shown in FIG. 2.

Referring to FIG. 3, the inversion signal INV1 is disabled whenever the strobe signal STROBE2 is enabled for odd periods (that is, period that odd data is input), and the inversion signal INV1 is enabled whenever the strobe signal STROBE2 is enabled for even periods. Therefore, the first, third, fifth, seventh, ... data outputted from the second driver 220 are not inverted by the pattern alteration unit 230, and the zeroth, second, fourth, sixth, ... data outputted from the second driver 220 are inverted by the pattern alteration unit 230.

An inversion signal INV2 may also be generated in the same way that the inversion signal INV1 is generated. In generating the inversion signal INV2, a strobe signal of a driver (not shown) coupled to the rear end of the pattern restoration unit 240 is used.

Figure 4:
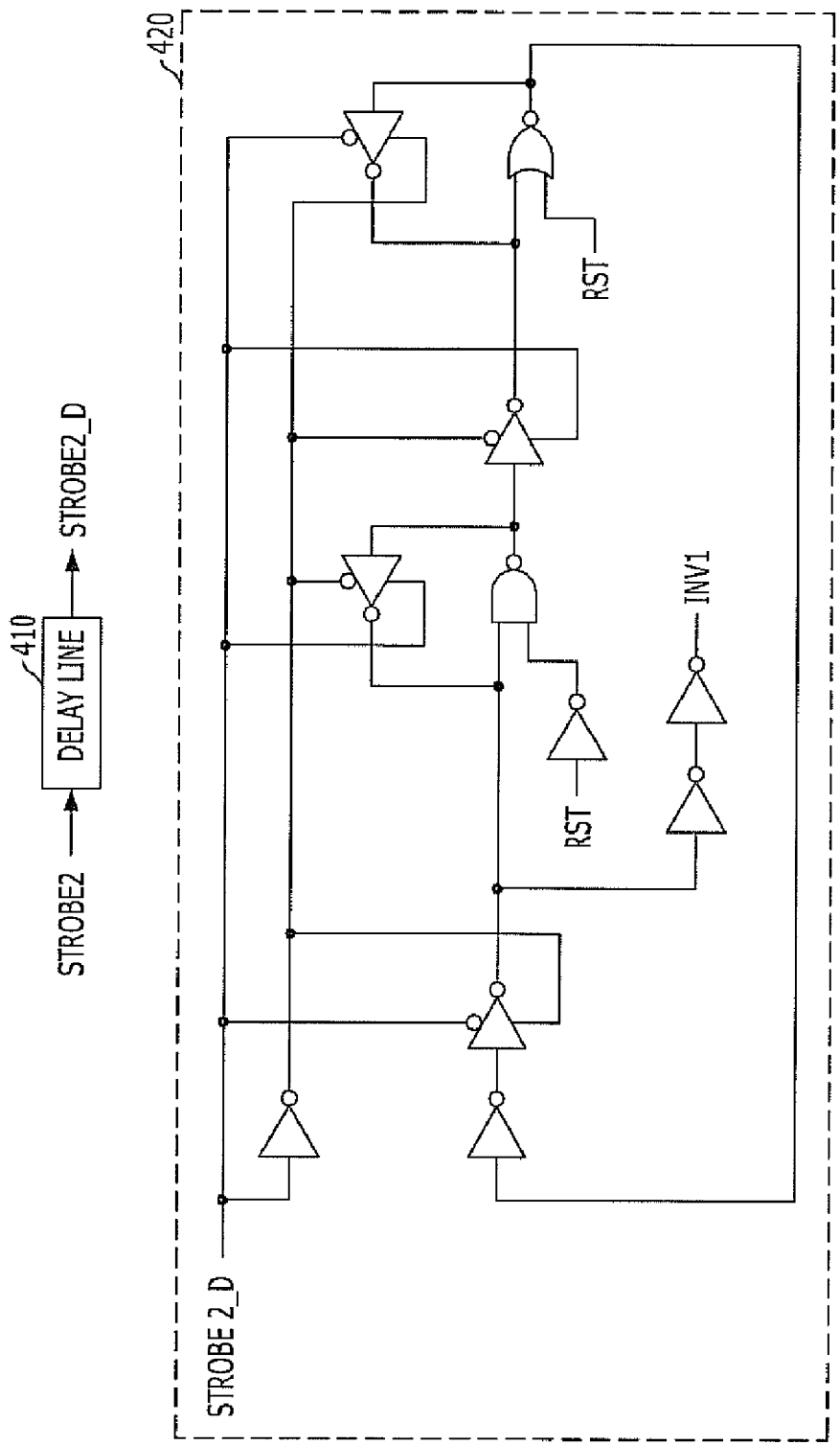
FIG. 4 illustrates a circuit for generating the inversion signal INV1 shown in FIG. 3.

FIG. 4 illustrates a circuit for generating the inversion signal INV1 shown in FIG. 3. A circuit generating the inversion signal INV1 by using the strobe signal STROBE2 includes a delay line 410 for delaying the strobe signal STROBE2, and an inversion signal generation circuit 420 for generating the inversion signal INV1 by using a delayed strobe signal STROBE2_D.

More specifically, the delay line 410 generates the delayed strobe signal STROBE2_D by delaying the strobe signal STROBE2. The inversion signal generation circuit 420 outputs a logic value of the inversion signal INV1 in response to a falling edge of the delayed strobe signal STROBE2_D.

Herein, an RST signal is a reset signal for initializing the inversion signal INV1 outputted from the circuit generating the inversion signal INV1 into a logic low level.

The above-described circuit structure is exemplary only and is not limiting. It would be apparent to those skilled in the art that other diverse circuit structures may be used to generate the inversion signal INV1 shown in FIG. 3.

Figure 5:
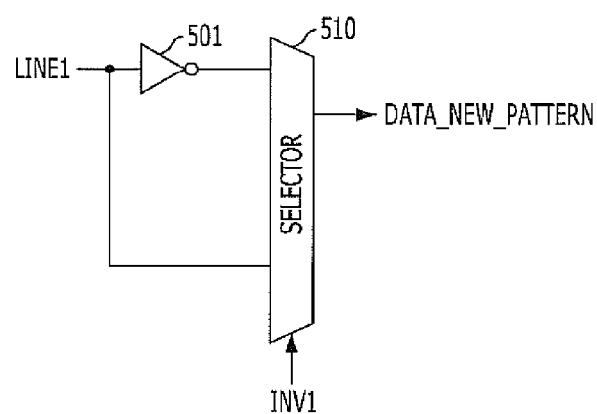
FIG. 5 is a schematic diagram of a pattern alteration unit 230 shown in FIG. 2.

FIG. 5 is a schematic diagram of the pattern alteration unit 230 shown in FIG. 2.

Referring to FIG. 5, the pattern alteration unit 230 may include an inverter 501 and a selector 510. The inverter 501 inverts data and outputs inverted data. The selector 510 selects output data of the inverter 501 or data on the first line LINE1 in response to the inversion signal INV1 and outputs the selected data. More specifically, when the inversion signal INV1 is enabled, the selector 510 selects and outputs the output data of the inverter 501. When the inversion signal INV1 is disabled, the selector 510 selects and outputs the data of the first line LINE1.

The pattern restoration unit 240 may be formed in the same way as the pattern alteration unit 230 is formed, except for receiving data on the second line LINE2 instead of the first line LINE1 and being controlled by the inversion signal INV2 instead of the inversion signal INV1.

Figure 6:
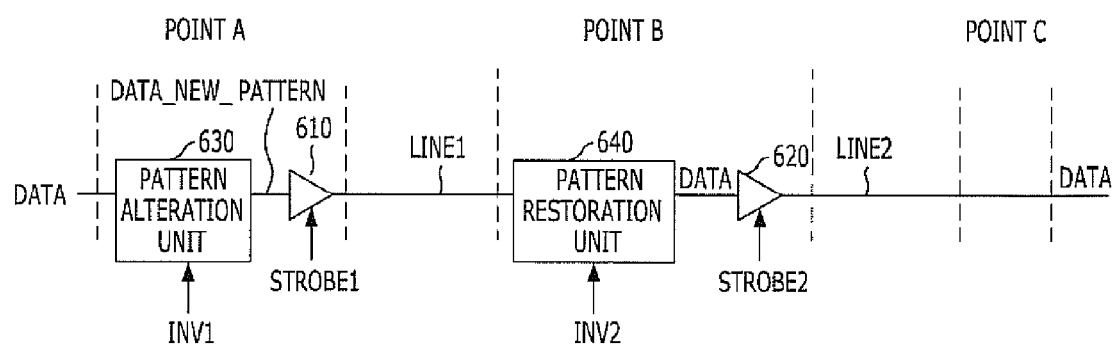
FIG. 6 is a schematic diagram of a data transfer circuit in accordance with another embodiment of the present invention.

FIG. 6 is a schematic diagram of a data transfer circuit in accordance with another embodiment of the present invention.

Referring to FIG. 6, a data transfer circuit includes a pattern alteration unit 630, a first driver 610, a pattern restoration unit 640, and a second driver 620. The pattern alteration unit 630 changes the pattern of input data DATA so as to produce pattern-changed data DATA_NEW_PATTERN. The first driver 610 drives the pattern-changed data DATA_NEW_PATTERN obtained from the pattern alteration unit 630 through a first line LINE1. The pattern restoration unit 640 restores the pattern of the data DATA transferred through the first line LINE1 back to the original pattern. The second driver 620 drives the data DATA whose pattern is restored in the pattern restoration unit 640 through a second line LINE2.

The pattern alteration unit 630 positioned at point A changes the pattern of the input data DATA. For selected input data DATA, when an inversion signal INV1 is enabled, the pattern alteration unit 630 inverts the inputted data DATA and outputs an inverted data, and when the inversion signal INV1 is disabled, the pattern alteration unit 630 outputs the inputted data DATA as received without an inversion. The inversion signal INV1 may be generated based on a strobe signal STROBE1 in the same method as described with reference to FIGS. 3 and 4. The pattern alteration unit 630 may be formed in the same way as the pattern alteration unit 230 shown in FIG. 2.

The first driver 610 drives the first line LINE1 between point A and point B with the pattern-changed data DATA_NEW_PATTERN received from the pattern alteration unit 630. The strobe signal STROBE1 is a signal for strobing the first driver 610. Whenever the strobe signal STROBE1 is enabled, the first driver 610 drives the pattern-changed data DATA_NEW_PATTERN through the first line LINE1.

The pattern restoration unit 640 positioned at point B restores the pattern of the pattern-changed data DATA_NEW_ PATTERN transferred through the first line LINE1 back to the original pattern. The operation of the pattern restoration unit 640 is the same as that of the pattern alteration unit 630. More specifically, the pattern restoration unit 640 re-inverts the inverted data produced in the pattern alteration unit 630. When an inversion signal INV2 is enabled, the pattern restoration unit 640 inverts the data of the first line LINE1 and outputs inverted data. When the inversion signal INV2 is disabled, the pattern restoration unit 640 outputs the data of the first line LINE1 as received without inverting it. The inversion signal INV2 may be generated based on a strobe signal STROBE2 in the same method as described with reference to FIGS. 3 and 4. The pattern restoration unit 640 may be formed in the same way as the pattern restoration unit 240 shown in FIG. 2 is formed.

The second driver 620 drives the data DATA whose pattern is restored by the pattern restoration unit 640 from point B to point C. The strobe signal STROBE2 input to the second driver 620 is a signal for strobing the second driver 620. Whenever the strobe signal STROBE2 is enabled, the second driver 620 drives the output data of the pattern restoration unit 640 through the second line LINE2.

According to the embodiment illustrated in FIG. 6, the pattern-changed data DATA_NEW_PATTERN output at the first line LINE1 by the pattern restoration unit 640 and the data DATA output at the second line LINE2 have different patterns. Therefore, a case where the pattern-changed data DATA_NEW_PATTERN of the first line LINE1 and the data DATA of the second line LINE2 transition frequently at the same time does not occur. Therefore, the peak current of the data transfer circuit is reduced.

Figure 7:
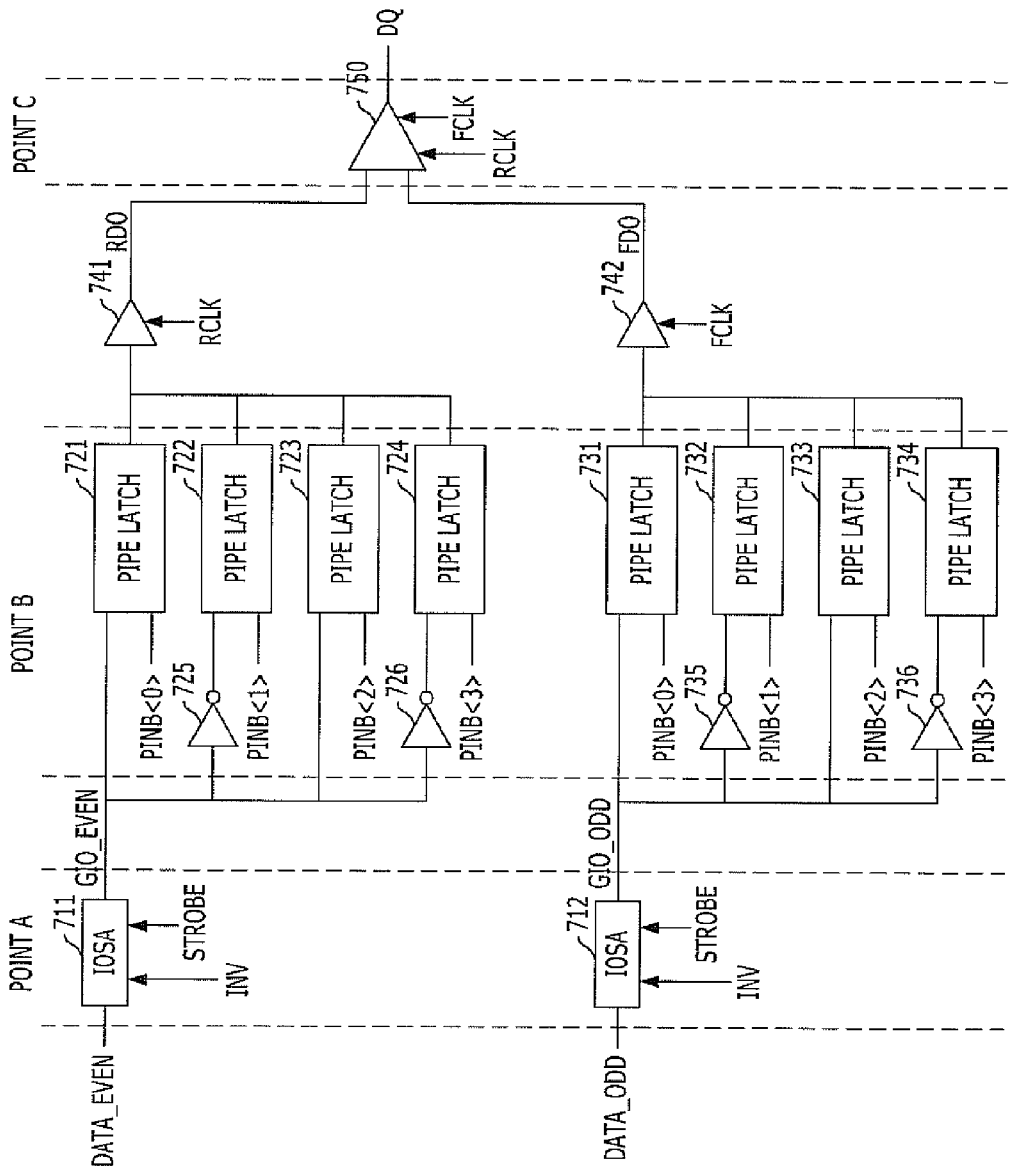
FIG. 7 is a schematic diagram illustrating a data transfer circuit applied to a memory device in accordance with an embodiment of the present invention.

FIG. 7 is a schematic diagram illustrating a data transfer circuit applied to a memory device in accordance with another exemplary embodiment of the present invention.

Referring to FIG. 7, the memory device includes an even sense amplifier 711 for driving even data DATA_EVEN (that is, the zeroth, second, fourth, sixth, . . . data) to an even global line GIO_EVEN and inverting selected data in driving the data; an odd sense amplifier 712 for driving odd data DATA_ODD (that is, the first, third, fifth, seventh, . . . data) to an odd global line GIO_ODD and inverting selected data in driving the data. Thus, data are separated into even data DATA_EVEN and odd data DATA_ODD and supplied to the sense amplifiers 711 and 712. The memory device further includes a plurality of even pipe latches 721 to 724 for sequentially receiving data of the even global line GIO_EVEN, a plurality of odd pipe latches 731 to 734 for sequentially receiving data of the odd global line GIO_ODD, a rising line driver 741 for sequentially transferring data stored in the plurality of even pipe latches 721 to 724 to a rising line RDO, and a falling line driver 742 for sequentially transferring data stored in the plurality of odd pipe latches 731 to 734 to a falling line FDO. Some of the plurality of the even pipe latches 721 to 724 invert the data it receives, and, similarly, some of the plurality of the odd pipe latches 731 to 734 invert their respective input data.

The even sense amplifier 711 drives the even data DATA_EVEN at the even global line GIO_EVEN in response to a strobe signal STROBE. In performing inversion of selected data, when an inversion signal INV is enabled, the even sense amplifier 711 inverts and drives the even data DATA_EVEN. When the inversion signal INV is disabled, the even sense amplifier 711 drives the even data DATA_EVEN as received without inverting the data. The even sense amplifier 711 has a structure corresponding to the pattern alteration unit 630 and the first driver 610 shown in FIG. 6. The inversion signal INV may have a changed logic level whenever the strobe signal STROBE is enabled.

The odd sense amplifier 712 drives the odd data DATA_ODD at the odd global line GIO_ODD in response to the strobe signal STROBE. When the inversion signal INV is enabled, the odd sense amplifier 712 inverts and drives the odd data DATA_ODD, and when the inversion signal INV is disabled, the odd sense amplifier 712 drives the odd data DATA_ODD without inverting the data. The odd sense amplifier 712 is a structure corresponding to the pattern alteration unit 630 and the first driver 610 illustrated in FIG. 6.

The plurality of the even pipe latches 721 to 724 sequentially receive and store data transferred through the even global line GIO_EVEN. The plurality of the even pipe latches 721 to 724 receive the data of the even global line GIO_EVEN in response to pipe input signals PINB<0> to PINB<3>. The pipe input signals PINB<0> to PINB<3> are enabled in the sequence of <0> to <3>. Therefore, the first data among the data transferred through the even global line GIO_EVEN is input to the even pipe latch 721 and the second data is input to the even pipe latch 722, while the third data is input to the even pipe latch 723 and the fourth data is input to the even pipe latch 724. The pipe latches 722 and 724 are coupled to inverters 725 and 726 for receiving inverted data of their respective data. Therefore, the pipe latches 722 and 724 store inverted data. The even pipe latches 721 to 724 correspond to the pattern restoration unit 640 shown in FIG. 6.

The plurality of the odd pipe latches 731 to 734 sequentially receive and store data transferred through the odd global line GIO_ODD. The plurality of the odd pipe latches 731 to 734 receive the data of the odd global line GIO_ODD in response to pipe input signals PINB<0> to PINB<3>. The pipe input signals PINB<0> to PINB<3> are enabled in the sequence of <0> to <3>. Therefore, the first data among the data transferred through the odd global line GIO_ODD is input to the odd pipe latch 731 and the second data is input to the odd pipe latch 732, while the third data is input to the odd pipe latch 733 and the fourth data is input to the odd pipe latch 734. The pipe latches 732 and 734 are coupled to inverters 735 and 736 for receiving inverted data of their respective data. Therefore, the pipe latches 732 and 734 store inverted data. The odd pipe latches 731 to 734 correspond to the pattern restoration unit 640 shown in FIG. 6.

The rising line driver 741 sequentially drives the rising line RDO with data stored in the even pipe latches 721 to 724 in response to a rising clock RCLK, which is a clock enabled at a rising edge of a clock CLK. The falling line driver 742 sequentially drives the falling line FDO with data stored in the odd pipe latches 731 to 734 in response to a falling clock FCLK, which is a clock enabled at a falling edge of CLK. The rising line driver 741 and the falling line driver 742 correspond to the second driver 620 of FIG. 6.

An output driver 750 outputs the data transferred through the rising line RDO and the falling line FDO to the exterior of a chip through a data pad DQ. The output driver 750 outputs data transferred through the rising line RDO at a rising edge of the clock CLK, and outputs data transferred through the falling line FDO at a falling edge of the clock CLK.

The following Table 3 shows the even data, the data of the even global line, and the data of the rising line, and Table 4 shows the odd data, the data of the odd global line, and the data of the falling line.

TABLE 3

| DATA_EVEN | GIO_EVEN | RDO |
|---|---|---|
| H, H, L, L | (H, L, L, H), medium level | (H, H, L, L), medium level |
| H, H, H, H | (H, L, H, L), high level | (H, H, H, H), low level |
| L, L, L, L | (L, H, L, H), high level | (L, L, L, L), low level |
| H, L, H, L | (H, H, H, H), low level | (H, L, H, L), high level |
| L, H, L, H | (L, L, L, L), low level | (L, H, L, H), high level |

TABLE 4

| DATA_ODD | GIO_ODD | FDO |
|---|---|---|
| H, H, L, L | (H, L, L, H), medium level | (H, H, L, L), medium level |
| H, H, H, H | (H, L, H, L), high level | (H, H, H, H), low level |
| L, L, L, L | (L, H, L, H), high level | (L, L, L, L), low level |
| H, L, H, L | (H, H, H, H), low level | (H, L, H, L), high level |
| L, H, L, H | (L, L, L, L), low level | (L, H, L, H), high level |

Referring to FIG. 3, if current consumption is high in one of the even global line GIO_EVEN and the rising line RDO, current consumption is not high on the other line regardless of the pattern of the even data DATA_EVEN. Current consumption is not high at both of the even global line GIO_EVEN and the rising line RDO.

Also, referring to FIG. 4, if current consumption is high in one of the odd global line GIO_ODD and the falling line FDO, current consumption is not high on the other line regardless of the pattern of the odd data DATA_ODD. Current consumption is not high at both of the odd global line GIO_ODD and the falling line FDO.

Therefore, the peak current of the memory device fabricated according to one embodiment of the present invention is reduced.

Figure 8:
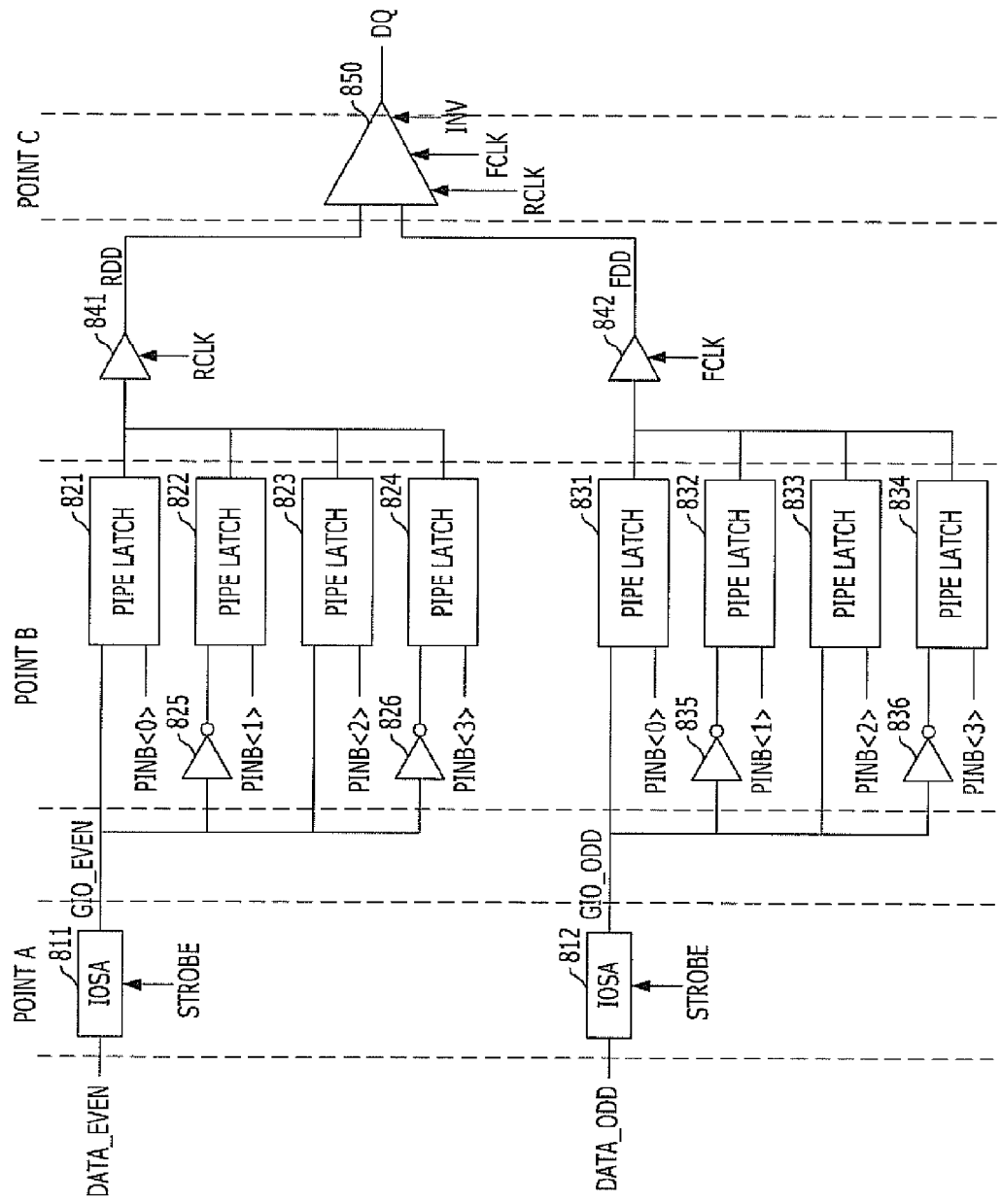
FIG. 8 is a schematic diagram illustrating a data transfer circuit applied to a memory device in accordance with another embodiment of the present invention.

FIG. 8 is a schematic diagram illustrating a data transfer circuit applied to a memory device in accordance with another embodiment of the present invention.

Referring to FIG. 8, the memory device includes an even sense amplifier 811 for driving even data DATA_EVEN to an even global line GIO_EVEN; an odd sense amplifier 812 for driving odd data DATA_ODD to an odd global line GIO_ODD; a plurality of even pipe latches 821 to 824 for sequentially receiving data of the even global line GIO_EVEN; a plurality of odd pipe latches 831 to 834 for sequentially receiving data of the odd global line GIO_ODD; a rising line driver 841 for sequentially transferring data stored in the plurality of the even pipe latches 821 to 824 to a rising line RDO; and a falling line driver 842 for sequentially transferring data stored in the plurality of the odd pipe latches 831 to 834 to a falling line FDO. The pipe latches 822 and 824 invert their respective input data, and, similarly, the pipe latches 832 and 834 invert their respective input data. The memory device also includes an output driver 850 which outputs data transferred through the rising line RDO and the falling line FDO to the exterior of a chip and inverts selected data and outputs the inverted data.

In the embodiment of FIG. 8, however, the pipe latches 822, 824, 832, and 834 change the pattern of data and the output driver 850 rechange the pattern of data. Thus, the embodiment of FIG. 7 is similar to that of FIG. 6, and the embodiment of FIG. 8 is similar to that of FIG. 2.

The peak current occurring in the memory cell is reduced in the embodiment of FIG. 8 because the data patterns in the even global line GIO_EVEN and the rising line RDO are controlled to be different, and the data patterns in the odd global line GIO_ODD and the falling line FDO are controlled to be different.

Figure 9:
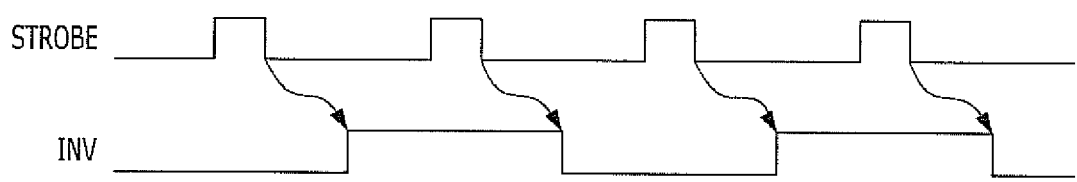
FIG. 9 illustrates a relationship between a strobe signal STROBE and an inversion signal INV shown in FIG. 7.

FIG. 9 illustrates a relationship between the strobe signal STROBE and the inversion signal INV shown in FIG. 7.

Referring to FIG. 9, whenever the strobe signal STROBE is enabled, the logic level of the inversion signal INV may be changed. The inversion signal INV may be generated based on the strobe signal STROBE in the circuit of FIG. 4.

Figure 10:
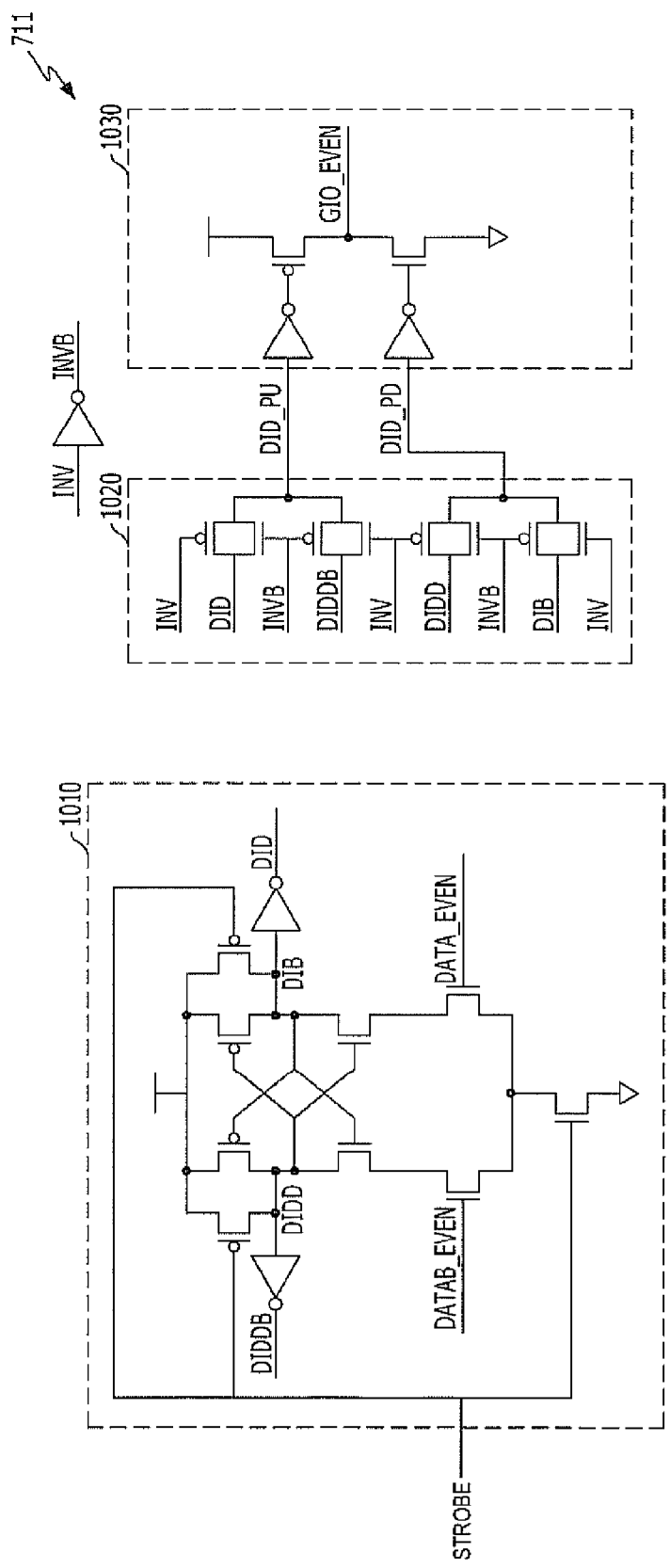
FIG. 10 is a schematic diagram of an even sense amplifier 711 shown in FIG. 7.

FIG. 10 is a schematic diagram of the even sense amplifier 711 shown in FIG. 7.

Referring to FIG. 10, the even sense amplifier 711 includes a differential amplifier 1010 for receiving and amplifying the even data DATA_EVEN and an inverted even data DATAB_EVEN; a selector 1020 for selecting an output signal DIDDB, DIDD, DID, or DIB of the differential amplifier 1010 based on the logic level of the inversion signal INV; and a driver 1030 for transferring the selected signal through the even global line GIO_EVEN.

In illustrating the operation of each constituent element, the differential amplifier 1010 is enabled by the strobe signal STROBE and amplifies the even data DATA_EVEN and the inverted even data DATAB_EVEN. When the inversion signal INV is disabled to a logic low level, output signals DID and DIDD of the differential amplifier 1010 are selected by the selector 1020 and input to the driver 1030. Therefore, the data of the even global line GIO_EVEN has the same logic level as that of the even data DATA_EVEN.

When the inversion signal INV is enabled to a logic high level, output signals DIDDB and DIB of the differential amplifier 1010 are selected by the selector 1020 and input to the driver 1030. Therefore, the data of the even global line GIO_EVEN has an inverse logic level from that of the even data DATA_EVEN. In short, the data of the even global line GIO_EVEN becomes an inverted even data DATAB_EVEN.

The odd sense amplifier 712 may be formed in the same method as the even sense amplifier 711.

Figure 11:
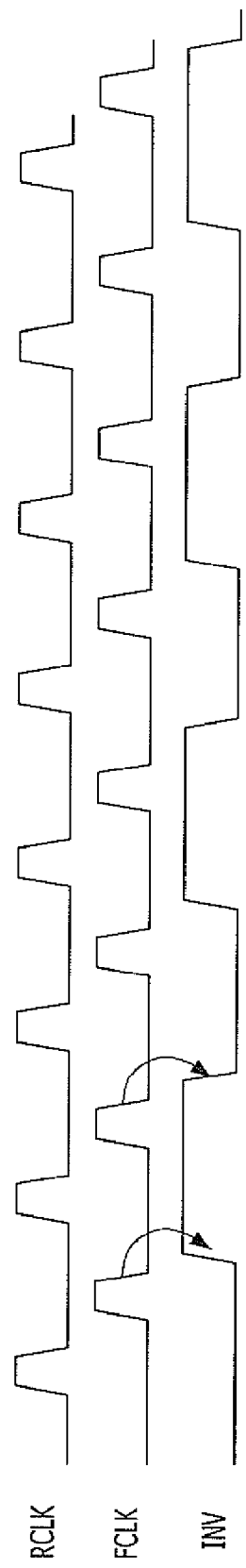
FIG. 11 illustrates a relationship between a rising clock RCLK, a falling clock FCLK, and an inversion signal INV shown in FIG. 8.

FIG. 11 illustrates a relationship between a rising clock RCLK, a falling clock FCLK, and an inversion signal INV shown in FIG. 8.

Referring to FIG. 11, the inversion signal INV is enabled when the rising clock RCLK and the falling clock FCLK are enabled for each even period (that is, a period when even data DATA_EVEN is received), and the inversion signal INV is disabled when the rising clock RCLK and the falling clock FCLK are enabled for each odd period (that is, a period when odd data DATA_ODD is received). Alternatively, the inversion signal INV may be generated based on the falling clock FCLK in the circuit shown in FIG. 4. In other words, the inversion signal INV is generated where the logic level of the inversion signal INV may be changed in response to a falling edge of the falling clock FCLK.

Figure 12:
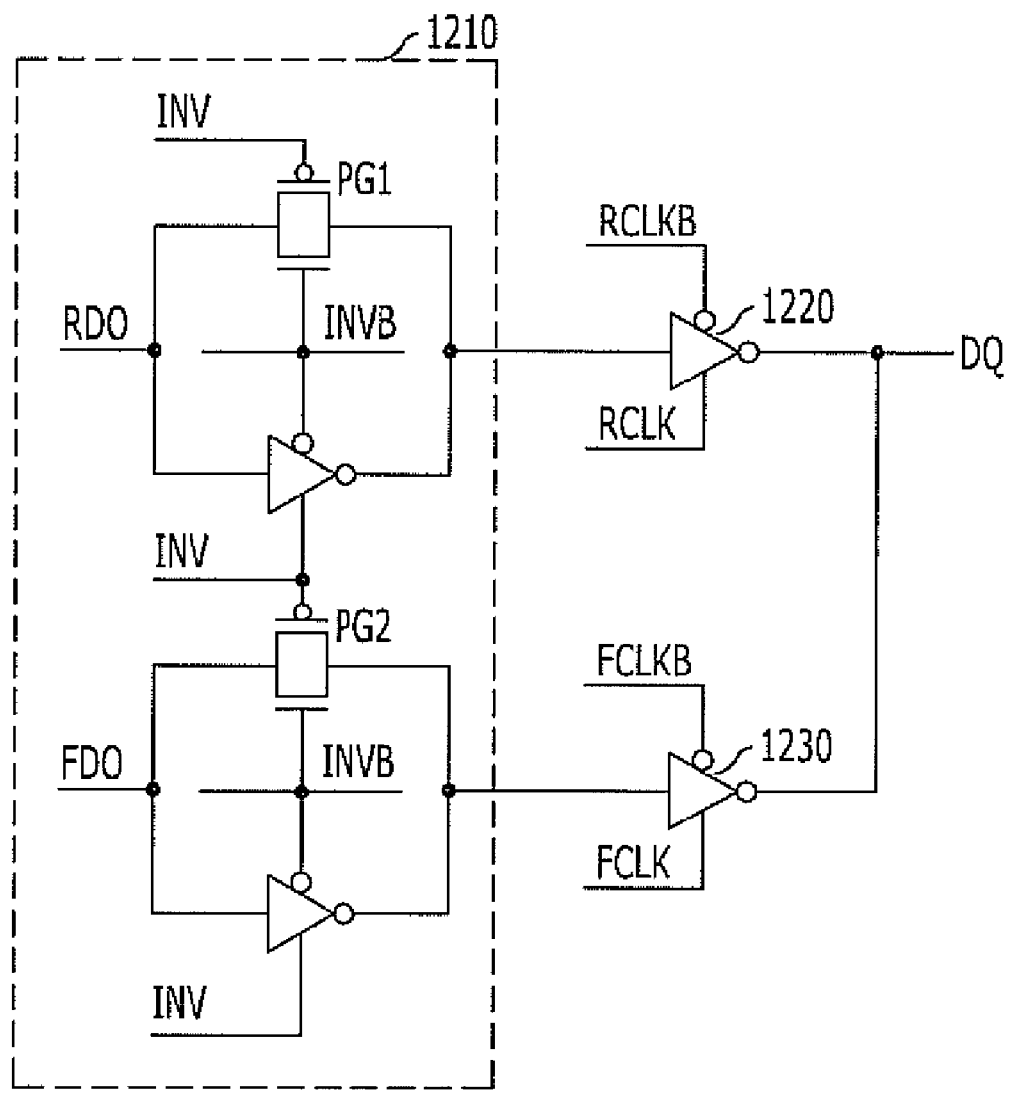
FIG. 12 is a schematic diagram of an output driver 850 shown in FIG. 8.

FIG. 12 is a schematic diagram of the output driver 850 shown in FIG. 8.

Referring to FIG. 12, the output driver 850 includes a selector 1210 for transferring the data of the rising line RDO and the data of the falling line FDO without inversion based on the logic level of the inversion signal INV or transferring them after inversion; a rising line driver 1220 for outputting a rising data selected by the selector 1210 in synchronization with the rising clock RCLK; and a falling line driver 1230 for outputting a falling data selected by the selector 1210 in synchronization with the falling clock FCLK.

When the inversion signal INV is in a logic low level, path gates PG1 and PG2 of the selector 1210 are turned on. Thus, the data of the rising line RDO is transferred to the rising line driver 1220 without inversion, and the data of the falling line FDO is transferred to the falling line driver 120 without inversion.

However, when the inversion signal INV is in a logic high level, inverters 1211 and 1212 of the selector 1210 are operated. Thus, the data of the rising line RDO is inverted and transferred to the rising line driver 1220, and the data of the falling line FDO is inverted and transferred to the falling line driver 120.

Hereafter, a method for transferring data in accordance with exemplary embodiments of the present invention will be described with reference to FIGS. 2 to 6.

A method for transferring data from point A to point C through point B includes: driving data from point A to point B; changing a pattern of the data transferred to point B; and driving the data with a changed pattern from point B to point C.

When the data is driven from point A to point C, the pattern of data is changed once in the midway, which is point B. Therefore, the data in the segment from point A to point B and the data in the segment from point B to point C have different data patterns. Therefore, a case where the data in the segment from point A to point B and the data in the segment from point B to point C transition frequently at the same time is prevented. As a result, the peak current is reduced while data is transferred.

The pattern of the data which is changed at point B may be changed using the same method used at point A (see FIG. 2). Alternatively, the pattern of data at point C may be changed using the same method used at point A (see FIG. 6).

According to an exemplary embodiment of the present invention, a data pattern is changed once at point B while data is transferred from point A to point C through point B. Therefore, although a data transition occurs frequently while the data is transferred from point A to point B, the data transition occurs less frequently in a section from point B to point C. In short, the data transition occurs frequently in a section from point A to point B or a section from point B to point C.

As described above, since the data transition is prevented from occurring in both of the section from point A to point B and the section from point B to point C for same data, the peak current of the data transfer circuit is reduced.

While the present invention has been described with respect to the specific embodiments, it will be apparent to those skilled in the art that various changes and modifications may be made without departing from the spirit and scope of the invention as defined in the following claims.

What is claimed is:

1. A data transfer circuit, comprising:
a first driver configured to drive a first line with data, wherein the data is a plurality of sequential data that have respective sequential orders in the sequence of data and are consecutively driven on the first line;
a pattern alteration unit configured to change a pattern of the data transferred through the first line and produce a pattern-changed data by inverting at least one of the plurality of sequential data based on the sequential order of the inverted sequential data in the sequence and not inverting at least one of the plurality of sequential data based on the sequential order of the non-inverted sequential data in the sequence;
a second driver configured to drive a second line with the pattern-changed data; and
a pattern restoration unit configured to receive the pattern-changed data transferred through the second line and re-invert the at least one data inverted by the pattern alteration unit.

2. The data transfer circuit of claim 1, wherein the pattern alteration unit is configured to control the number of transitions of the pattern-changed data on the second line to be different from the number of transitions of the data on the first line for the same data.

3. The data transfer circuit of claim 1, wherein the pattern alteration unit is configured to invert alternative bits of the data.

4. The data transfer circuit of claim 1, wherein the pattern restoration unit is configured to invert alternative bits of the data.

5. A data transfer circuit, comprising:
a pattern alteration unit configured to receive input data that is a plurality of sequential data that have respective sequential orders in the sequence of data and are consecutively input to the pattern alternation unit and configured to change a pattern of the input data and produce pattern-changed data by inverting at least one of the plurality of sequential data based on the sequential order of the inverted sequential data in the sequence and not inverting at least one of the plurality of sequential data based on the sequential order of the non-inverted sequential data in the sequence;
a first driver configured to drive a first line with the pattern-changed data received from the pattern alteration unit;
a pattern restoration unit configured to receive the pattern-changed data transferred through the first line, re-invert the at least one data inverted by the pattern alteration unit, and produce restored data; and
a second driver configured to drive a second line with the restored data.

6. The data transfer circuit of claim 5, wherein the pattern restoration unit is configured to control the number of transitions of the restored data on the second line to be different from the number of transitions of the pattern-changed data on the first line for the same data.

7. A memory device, comprising:
a plurality of even pipe latches configured to sequentially receive data of an even first line;
a plurality of odd pipe latches configured to sequentially receive data of an odd first line;
a rising line driver configured to sequentially transfer the data stored in the plurality of the even pipe latches through a rising second line; and
a falling line driver configured to sequentially transfer the data stored in the plurality of the odd pipe latches through a falling second line,
wherein a group of even pipe latches among the plurality of the even pipe latches are configured to invert data inputted thereto, and a group of odd pipe latches among the plurality of the odd pipe latches are configured to invert data inputted thereto.

8. The memory device of claim 7, further comprising:
an even sense amplifier configured to drive data through the even first line; and
an odd sense amplifier configured to drive data through the odd first line,
wherein the even sense amplifier and the odd sense amplifier are configured to invert a portion of data driven by the even sense amplifier and the odd sense amplifier.

9. The memory device of claim 8, wherein the group of even pipe latches which invert data inputted thereto are configured to invert the inverted data received from the even sense amplifier, and the odd pipe latches which invert data among the plurality of the odd pipe latches are configured to invert the inverted data received from the odd sense amplifier.

10. The memory device of claim 7, further comprising:
an output driver configured to output data transferred through the rising second line and data transferred through the falling second line to outside of a chip,
wherein the output driver is configured to invert a portion of the data to be outputted to outside of the chip and output the inverted data.

11. The memory device of claim 10, wherein the output driver is configured to invert the inverted data received from the group of even pipe latches which invert data inputted thereto and the inverted data received from the group of odd pipe latches which invert data inputted thereto, and output the inverted data.

12. A method for transferring a data from a first point to a third point through a second point, comprising:
driving data from the first point to the second point, wherein the data is a plurality of sequential data that have respective sequential orders in the sequence of data and are consecutively driven from the first point to the second point;
changing a pattern of the data transferred to the second point and producing a pattern-changed data by inverting at least one of the plurality of sequential data based on the sequential order of the inverted sequential data in the sequence and not inverting at least one of the plurality of sequential data based on the sequential order of the non-inverted sequential data in the sequence; and
driving the pattern-changed data from the second point to the third point.

13. The method of claim 12, wherein the changing the pattern of the data transferred to the second point is performed in such a manner that the number of transitions of the data driven from the first point to the second point is different from the number of transitions of the pattern-changed data driven from the second point to the third point.

14. The method of claim 12, further comprising:
re-inverting the at least one inverted sequential data after the pattern-changed data is transferred to the third point.

15. The method of claim 14, wherein the re-inverting of the at least one inverted sequential data makes the pattern-changed data transferred to the third point to have the same pattern as the data at the first point.

16. The method of claim 12, further comprising:
inverting the at least one inverted sequential data before the driving of data from the first point to the second point.

17. The method of claim 16, wherein the data pattern change occurring at the second point is performed to re-invert the at least one inverted sequential data obtained before the driving of data from the first point to the second point.

* * * * *